March 19, 1968 M. DAVIS ETAL 3,374,405

SEMICONDUCTIVE DEVICE AND METHOD OF FABRICATING THE SAME

Filed June 22, 1965

INVENTORS
MITCHELL DAVIS
MINERVA L. SOWERS
BY
Frank D. Prager
ATTORNEY

United States Patent Office 3,374,405
Patented Mar. 19, 1968

3,374,405

SEMICONDUCTIVE DEVICE AND METHOD OF FABRICATING THE SAME

Mitchell Davis, Conshohocken, and Minerva L. Sowers, West Point, Pa., assignors to Philco-Ford Corporation, a corporation of Delaware Filed June 22, 1965, Ser. No. 466,008
13 Claims. (Cl. 317—234)

ABSTRACT OF THE DISCLOSURE

A semiconductive diode, and fabrication thereof. An etchant is applied to surface material of a semiconductor wafer, which material includes a body of semiconductor metal alloy. Thereafter, another etchant is applied which attacks only said alloy. The resultant product has a primary mesa projecting from surrounding surface portions of the wafer, and a smaller secondary mesa on the primary one. A rectifying junction is provided between the smaller mesa and the primary one.

*Nature and objects of the invention*

Certain diodes, particularly tunnel diodes, have extremely thin rectifying junctions by virtue of which their rectifying efficiency is very high. Thus far, however, tunnel diodes have been relatively low frequency devices. The extreme thinness of their junction causes high parasitic capacitance, as a result of which they have not thus far been well adapted for operation in certain microwave applications.

It is an object of the invention to minimize this parasitic capacitance of tunnel diodes and the like and for this purpose greatly to reduce the area of the thin diode junction.

It is a further object of the invention to minimize other limiting characteristics, such as resistance of the diode, which increases with the length of the necked-down junction area. Still another object is to avoid certain sources of mechanical trouble, encountered in making the diode. Briefly, the invention provides a semiconductive device which is of both low resistance and low capacitance, whereby to rectify currents with unusually high efficiency at unusually high frequencies, and which is rugged enough to withstand the stresses imposed on it during fabrication and use.

The objectives are achieved by providing a diode of stepped or two-stage mesa form. A preferred form of the new diode comprises a mesa of microscopically minute size, on the surface of a primary mesa of considerably more ample dimensions. These several elements are produced by a new and relatively simple two-stage etching process. The disclosure which follows will show the ways in which the new diode fabricating process and the new structural features of the diode contribute to the achievement of our invention—the successful production of a diode having extremely high rectifying efficiency at extremely high frequencies.

In the drawing FIGURE 1 shows a diode according to our invention, greatly enlarged and in central vertical section. FIGURE 2 presents a fragmentary and still more enlarged view, similarly showing the junction part of the diode. FIGURE 3 shows a still smaller fragment, in still greater enlargement especially with respect to vertical dimensions, and again in generally similar view.

FIGURES 5 and 6 are showings generally similar to

Figure 1:
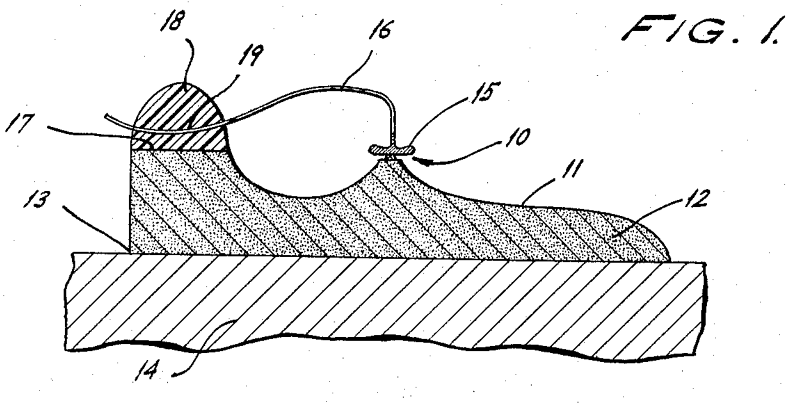
Figure 2:
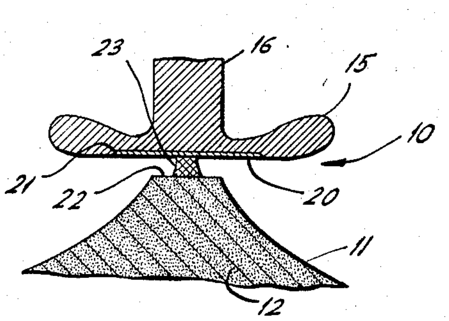

FIGURE 2, and illustrating certain steps in the process of fabricating the diode of FIGURES 1 to 4.

Referring first to FIGURE 1: the new diode 10 is formed as a central portion of a top surface region 11 on semiconductor element 12. This element can be a conventional germanium die or chip, which can be secured, at 13, to a metallic stud 14. Diode 10 and stud 14 are connected to an outside circuit, not shown, for which purpose a thermal compression bonding unit or "nailhead" 15 is utilized, bonding a connector wire 16 to the diode junction region. A short distance from this nailhead the connector wire is shown as being secured to a surface portion 17 of die 12 slightly spaced from the central region. This latter securement can for instance be effected by a small cementitious holder 18, made of epoxy resin or the like, wherein a portion 19 of the connector wire is embedded.

As more fully shown in FIGURE 2 the central portion of top surface 11 of the semiconductor unit presents what may be called a two-stage mesa structure. This structure has nailhead 15 bonded thereto by means of a central portion of lower surface 20 on said nailhead, wherein a thin film 21 of suitable material is embedded to provide an effective ohmic connection, as will be described with greater particularity hereinafter. Facing this lower surface 20 of thin film 21 and minutely spaced therefrom, the upper surface of semiconductor blank 12 has a flat central top portion, identified herein as primary mesa 22, and which centrally supports a secondary mesa 23 of much smaller height and of considerably smaller diameter. The diameter of the primary mesa can be of the same order as the diameter of wire 16, as illustrated; or it can be of larger diameter than this wire; however, it is at least somewhat smaller than the diameter of the nailhead, for reasons of the manufacturing process to be noted hereinafter. The two mesas are of opposite conductivity types and preferably primary mesa 22 is formed of n-type semiconductive material such as germanium, while secondary mesa 23 is formed of p-type semiconductive material such as a suitably recrystallized germanium aluminum alloy.

The aforesaid secondary mesa or submesa 23, interposed between central portions of lower and upper surfaces 20, 22, constitutes a generally drum shaped body of suitable alloy, as described hereinafter. It is of microscopic size, as is the aforementioned spacing between said surfaces.

Figure 3:
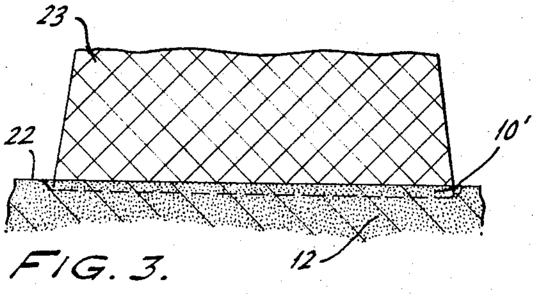

Even smaller is the mesa junction depletion region or layer 10', shown in FIGURE 3. It is formed at the interface between primary mesa 22 and secondary mesa 23, and extends very minutely into the primary or n-type mesa. In typical embodiments of this invention this junction depletion layer 10' has a thickness which amounts only to a small fraction of a wavelength of visible light, for instance to about 100 angstrom units (.0004 mil). The height of the microscopic secondary mesa 23, more completely shown in FIGURE 2 can be about .1 mil and its base diameter about 0.2 mil, while typical diameters of whisker wire 16 and primary mesa 22 can for instance be of the order of about 1 mil. It will be seen that the relative dimensions of secondary mesa 23 often are even smaller than illustrated in FIGURE 2.

Figure 4:
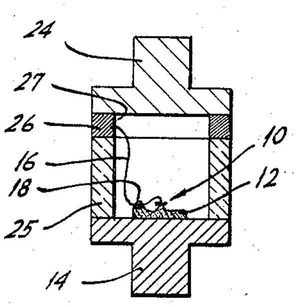
FIGURE 4 shows the entire diode unit, complete with housing and connectors, in central vertical sectional view taken on a scale much smaller than those of FIGURES 1 to 3 but which still is several times larger than an actual device according to this invention.

As illustrated in FIGURE 4, the metallic stud 14 of diode 10 supports a housing which surrounds the germanium die and provides, as a cover for the same, a second metallic stud 24 opposite diode 10. The housing comprises ceramic wall 25 and a suitable metallic ring 26 on top of said wall, interconnecting the same with stud and cover 24. Connector wire 16, which desirably is made of gold, has a free end 27 beyond resin drop 18. This wire end 27 is mechanically and electrically connected to metallic ring 26, as by soldering or welding. Portions of an outer circuit, not shown, are connected to the diode by being suitably connected to studs 24 and 14, thereby providing connections to the two sides of the junction.

The extreme thinness of this junction (FIGURE 3) causes high parasitic capacitance between primary and secondary mesas 22, 23. In the presence of such capacitance it is impossible to operate a diode at microwave frequencies and especially at extremely high microwave frequencies, above 3 billion cycles per second. Such operation can be achieved only by minimizing the junction area. This in turn requires minimizing the horizontal dimensions of at least one diode element, directly bordering on the junction. This is difficult, and was heretofore achievable only in ways whereby other electric characteristics of great importance, such as the series resistance values of diodes, became unduly large, as occurs when the junction connection becomes elongated. The new structure 10 on the other hand allows effective operation in the indicated frequency range, by virtue of the new, stepped arrangement of primary and secondary mesas 22, 23, with junction 10′ therebetween.

The way in which this structure is produced will be explained additionally, all more fully, in connection with the following description of the new process.

Figure 5:
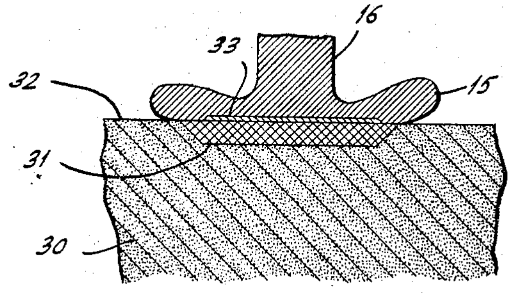

Initially, an n-type germanium wafer is provided with a thin film of aluminum on a flat surface thereof, and this film is etched back to leave only dots of aluminum. The blank is divided into dies, each with one aluminum dot. Heat is applied, for instance in a flash-heating process known by itself. These operations produce a germanium die 30 (FIGURE 5) with a layer 31 of germanium aluminum alloy formed in a portion of surface 32 thereof, while a thin film dot 33 of aluminum germanium alloy remains as a residium of the original aluminum dot. When the germanium die has been prepared in this way, gold wire 16 is bonded to the aluminum germanium dot 33 by thermal compression bonding, producing nailhead 15 and thereby providing the unit of FIGURE 5 with an effective ohmic connection to whisker 16.

Figure 6:
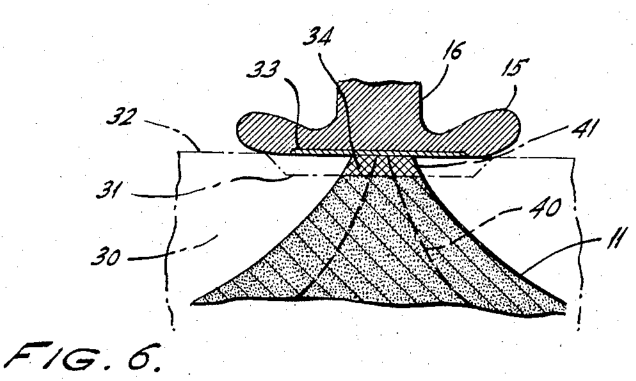

The new process then continues with a novel two-stage electrolytic etching operation. During a first stage of this operation, potassium hydroxide (KOH) and electrolytic current are applied for electrolytic etching of material of die 30. The action of the electrolytic etching process begins at the periphery of nailhead 15, and initially forms a small annular groove or moat (not shown) in the germanium, around this nailhead. Advantageously the process is continued to remove n-type germanium as well as p-type germanium from the die, such removal taking place at all unmasked surface portions and in a progressive way, tending to make primary mesa 22 progressively higher and to make its top surface progressively smaller. FIGURE 6 illustrates, in full lines, the condition which exists at the end of this first stage. The "bulk" of the small die 12 has been greatly reduced, and a curved top surface 11, somewhat like that of a cone frustum, rising to the central underside of the nailhead, has been produced on the die. Only small central portions of the original surface area of the die, with p-type material in the top region thereof, have been retained under the nailhead, as is shown at 34 and directly therebelow.

The invention combines this application of KOH—by itself a known expedient in the fabrication of semiconductor devices—with an application of oxalic acid ($H_2C_2O_4 \cdot 2H_2O$) for a further electrolytic etch. This acid has heretofore been known as a mild multi-purpose agent, for instance for the bleaching of fabrics and the removal of ink spots, rust, etc. When applied for electrolytic etching of semiconductors in accordance with the new process, this agent has a particular, selective property; it attacks substantially only p-doped germanium, present in central surface portion 34, and does not attack the underlying n-type germanium of die 12.

Accordingly the oxalic acid is used further to reduce only said p-doped region 34 of the intermediate product of FIGURE 6. The polarity of the electric current is not changed, and the voltage can be kept uniform. The acid then etches surface portion 34, and thereby produces the unit of FIGURE 2.

This resulting unit has the small primary mesa 22 properly centered relative to the similarly small nailhead 15, and has a second and even smaller mesa 23 between this nailhead and the first mesa. Parasitic capacity is reduced to a minimum, as is the parasitic series resistance of junction elements. In addition, firm mechanical and electrical connections are provided by virtue of the new process, between the top of secondary mesa 23 and the connector structure 21, 15, 16 on the one hand, and in the junction area at primary mesa surface 22 on the other hand. These several advantages can be further explained as follows, with reference to the new process and in comparison with the results of other processes.

While the extreme thinness of junction 10 (FIGURE 3) inherently produces extremely high capacitance per unit junction area, the actual capacitance of the new diode is minimized or at least kept within certain limits by the feature that the diameter of this junction has been reduced to a mere fraction of a mill, as noted above. This has been achieved by the second stage of the new etching process, wherein the p-type region is necked down to smaller cross-sectional area to produce efficient operation at microwave frequencies. Problems of this area-reducing process, and the solution of such problems, will be discussed presently.

It is known to be possible to employ oxalic acid for a cleaning operation or the like, and an attempt might be made exclusively, or substantially exclusively, to use this agent, with suitable electrolytic action, for the removal of p-type germanium from the vicinity of nailhead 15. In that event, however, it is difficult in many cases to establish contact between the acid and the p-type germanium, and even if this difficulty is overcome, another serious problem is encountered. The acid then attacks substantially only the p-type layer 31 of blank 30, shown in FIGURE 6 by broken line 31. Inwardly successive ring portions of this layer are then etched away, and the surface of the resulting unit then has an outer flat portion 32, an intermediate shallowly recessed portion marked by said broken line 31, and an inner mesa portion 41. When such a type of etching is applied instead of the one claimed herein, a very small aperture exists between the gold of nailhead 15 and the surfaces of recess 31. As a result of this condition the necked-down p-type germanium body then tends to break, even upon such minor agitation as results from the application of the oxalic acid electrolytic etchant, under the nailhead, and from the evolution of minute bubbles of gas incident to the electrolytic etching.

Operations of somewhat different nature can also be used instead of the new two-stage process to produce a junction of very small diameter, but they cannot achieve a diode of such favorable parameters as the one described herein. For instance, as indicated in FIGURE 6 by broken line 40, the conventional etching process using only KOH can reduce the germanium body beyond and below the boundary 11 reached at the end of the above-mentioned first stage. In this event, however, not only p-type but also n-type portions of the germanium body become very thin and elongated, as is indicated by said broken line 40; a similar result may also be noted in copending application Serial No. 446,503, now Patent #3,296,507, filed on Apr. 8, 1965, by Mitchell Davis (co-applicant herein, Richard L. Goldman and Victor C. Sirvydas, which application is owned by our assignee. By contrast, our new diode (FIGURE 2) has a thin but also short neck 23, followed by a primary mesa 22 of fairly wide cross-section. The respective cross-sections of diodes 10 and 40 can be compared by considering FIGURES 2 and 6, one in conjunction with the other. The series resistance of the n-type germanium body in diode 10 or 40 is dependent on the thinness or thickness of this body, bounded by line 11 or 40. This resistance is therefore small (typically, about 1 ohm) when use is made of the new and relatively amply dimensioned primary mesa 22. By contrast, when the conventional etch by KOH is continued to a position such as 40, a much higher resistance (generally of several ohms) results. In many cases such higher resistance is very much less desirable than the aforementioned, relatively low resistance of the new unit.

Therefore the new two-stage etch (see full lines in FIGURES 6 and 2) is distinctly superior to other and more conventional processes such as those specifically illustrated by broken lines 40 and 41 in FIGURE 6. As a result of the reduction of junction area, and retention of substantial cross-sectional area in the primary mesa, as achieved by the new two-phase process, a new two-step diode structure is produced which has relatively low resistance, as well as relatively low capacitance. It avoids substantially any avoidable, parasitic capacitance and resistance.

The new diode has been produced with diode series resistance ($R_s$) of typically about 1 ohm at a capacitance ($C_j$) of about .5 picofarad and, in other samples, with typically about 1.5 ohm at about .3 picofarad. These diodes were tested successfully at frequencies of 9 to 10 billion cycles per second. They remained successfully operable after severe mechanical and thermal shock. Such diodes were made by applying the new two-stage process in the following way: As a first stage a 2-normal KOH solution was applied at room temperature. This was followed as a second stage by a 2-normal oxalic acid solution, again at room temperature. Added to the oxalic solution was a minute quantity of wetting agent, for instance .1% Enthone. Also added to the oxalic acid was 20% of hydrogen peroxide ($H_2O_2$), which served to produce a smooth finish of the secondary mesa. During the etch, electronic characteristics of the diode were monitored with the help of oscilloscope display, in a way known to the art.

While only a single embodiment of the invention has been fully described, the details thereof are not to be construed as limitative of the invention. The invention contemplates such variations and modifications as come within the scope of the appended claims.

We claim:

1. A diode unit comprising a primary mesa of germanium projecting from a surface of a germanium (n-type) wafer; a smaller secondary mesa of germanium-aluminum alloy thereon; a whisker wire having one end bonded to the top of the secondary mesa and another end bonded to a stud; and a stud bonded to the bottom of the wafer.

2. In a diode, a primary mesa of n-type germanium projecting from a surface of a wafer of the same material; a smaller secondary mesa of p-type germanium alloy on said primary mesa; a nailhead of gold having a bottom surface a portion of which is bonded to the top of the secondary mesa; and a whisker wire bonded to said nailhead.

3. A diode as described in claim 2 wherein said nailhead has a film of aluminum germanium alloy in the lower surface thereof, a central portion of said film being bonded to said secondary mesa.

4. A semiconductor unit comprising a small germanium wafer with a minute germanium mesa thereon; an even more minute germanium aluminum submesa, on said mesa, the several dimensions of said submesa being small fractions of a mil; and electric conductors connected by ohmic connections, one to the bottom of the wafer and one to the top of the submesa.

5. A unit as described in claim 4, wherein the conductor connected to the top of the submesa comprises a whisker wire having an end thermocompressively bonded to said top.

6. A unit as described in claim 5, also including means for holding a portion of said whisker wire other than said nailhead to said wafer, adjacent said mesa.

7. A semiconductor unit comprising a semiconductive mesa projecting from a surface of a semiconductive body; a junction of smaller area than the top surface of the mesa, in a surface portion of said mesa; a semiconductive secondary mesa, of similar area as the junction and of different conductivity type than the first-mentioned mesa, slightly upstanding from said junction; and a connector bonded to the top of the secondary mesa.

8. A unit as described in claim 7 wherein the area of the first-mentioned mesa is similar to, and that of the secondary mesa is smaller than, the cross-sectional area of the connector.

9. In the fabrication of a diode: providing a germanium blank with a germanium-aluminum alloy dot; etching away surface material of said germanium blank and said alloy dot and thereafter etching substantially only said alloy dot to reduce its cross-section.

10. A method of fabricating tunnel diodes comprising the steps of providing germanium blanks with germanium aluminum dots in surfaces of the blanks and with wires bonded to said dots; applying KOH to said surfaces to etch away portions of the germanium and germanium aluminum alloy, around and below the wire bonds; and then applying oxalic acid to etch portions of the germanium aluminum alloy and further to reduce its cross-sectional area.

11. In a method of fabricating a diode: providing a germanium blank with an aluminum dot in its surface; alloying aluminum of the dot with the blanks; thermocompressing an end of a gold whisker wire to the resulting alloy dot to provide a nailhead; etching germanium and germanium aluminum alloy around and below the nailhead to produce a primary mesa and an etched germanium aluminum body connecting it with the center of the nailhead; and then etching only the germanium aluminum to reduce it to a secondary mesa on said primary mesa while leaving it connected to the nailhead.

12. In a method of providing a germanium body with a germanium alloy junction: applying KOH to said body to etch germanium and germanium alloy away, and then applying oxalic acid to said body to etch only portions of the germanium alloy away.

13. In the fabrication of a tunnel diode with a junction of n-type germanium and p-type germanium alloy: etching said germanium and germanium alloy to produce a small primary mesa, and then etching substantially only said germanium alloy to produce a minute secondary mesa on said primary mesa.

References Cited

UNITED STATES PATENTS

| | | | |
|---|---|---|---|
| 3,140,527 | 7/1964 | Valdman et al. | 29—25.3 |
| 3,283,218 | 11/1966 | Goldman et al. | 317—234 |
| 3,293,092 | 12/1966 | Gunn | 156—17 |
| 3,296,507 | 1/1967 | Davis et al. | 317—234 |

FOREIGN PATENTS

| | | |
|---|---|---|
| 1,017,652 | 1/1966 | Great Britain. |
| 1,339,892 | 9/1963 | France. |

JOHN W. HUCKERT, *Primary Examiner.*

A. M. LESNIAK, *Assistant Examiner.*